(12) United States Patent
Kang

(10) Patent No.: US 7,361,524 B2
(45) Date of Patent: Apr. 22, 2008

(54) METHOD OF MANUFACTURING FLOATING STRUCTURE

(75) Inventor: Seok-jin Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/341,613

(22) Filed: Jan. 30, 2006

(65) Prior Publication Data

US 2006/0183332 A1    Aug. 17, 2006

(30) Foreign Application Priority Data

Feb. 14, 2005  (KR)  ............. 10-2005-0011836

(51) Int. Cl.
*H01L 21/00* (2006.01)
(52) U.S. Cl. ............... 438/53; 438/50; 216/2; 73/514.01; 257/E21.606
(58) Field of Classification Search ......... 438/691, 438/120, 50, 51, 52, 53, 719, 733, 735; 216/2, 216/33, 36, 39; 73/503.03, 514.01, 503.3
See application file for complete search history.

(56) References Cited

U.S. PATENT DOCUMENTS 5,199,298 A * 4/1993 Ng et al. ............... 73/54.01
5,925,924 A * 7/1999 Cronin et al. ............ 257/622

FOREIGN PATENT DOCUMENTS

WO    WO2004/105428 A1 * 12/2004

OTHER PUBLICATIONS

J. Shaji, K. Ng, M.A. Schmidt, "A microfabricated floating-element shear stress sensor using wafer-bonding technology", 1992, Journal of Microelectromechanical Systems, vol. 1 No. 2, pp. 89-94.*

* cited by examiner

*Primary Examiner*—Michael S. Lebentritt
*Assistant Examiner*—Reema Patel
(74) *Attorney, Agent, or Firm*—Sughrue Mion, PLLC

(57) ABSTRACT

A method of manufacturing a floating structure capable of providing increased device yield. The method includes: a) forming an insulation film, a predetermined area of which is removed, between a first substrate and a second substrate; and b) forming a floating structure in the removed predetermined area.

15 Claims, 4 Drawing Sheets

METHOD OF MANUFACTURING FLOATING STRUCTURE

CROSS-REFERENCE TO RELATED APPLICATIONS

This application claims the benefit of Korean Patent Application No. 2005-11836 filed on Feb. 14, 2005 in the Korean Intellectual Property Office, the disclosure of which is incorporated herein by reference.

BACKGROUND OF THE INVENTION

1. Field of the Invention

The present invention relates to a method of manufacturing a micro floating structure capable of providing improved device yield.

2. Description of the Related Art

A micro floating structure as mentioned above is used as an inertia weight, a spring or the like in a sensor such as an accelerometer or gyroscope. A conventional method of manufacturing such a micro floating structure is illustrated in FIGS. 1A to 1E.

Referring to FIGS. 1A and 1B, according to the conventional method, first and second oxide films 12, 22 are formed on one surface of each of first and second substrates 10, 20, respectively, and then the first and second substrates 10, 20 are bonded to one another such that the first and second oxide films 12, 22 face one another.

Then, the second substrate 20 is polished to a thickness of the floating structure 30 (see FIG. 1D), as shown in FIG. 1C.

Next, the polished second substrate 20 is subjected to photolithographic and dry etching processes to form the floating structure 30, as shown in FIG. 1D.

Then, if the first and second oxide films 12, 22 formed underneath of the floating structure 30 are removed by wet etching, the floating structure 30 is in a state in which the bottom surface thereof floats above the first substrate 10, as shown in FIG. 1E.

During the manufacturing process described above, dry etching is performed by bombarding ion beams against the polished second substrate 20. However, if the second oxide 22 is exposed while the etching is proceeding, ion beams are injected into the second oxide film 22 whereby the second oxide film 22 becomes charged. If so, the path of subsequent ion beams will be changed by the electrostatic force of the second oxide film 22, and the path-changed ion beams will produce notches 32 on the bottom side of the floating structure 30. Although the drawing shows several notches 32 on floating structure 30 formed thereby, a countlessly large number of fine notches 32 are practically formed on the bottom side of each floating structure 30. Such notches 32 change the physical properties such as mass and spring constant of the floating structure 30, thereby causing an error from a design value. In addition, the path-changed ion beams will produce needle-shaped by-products ablated from the notches 32 while the notches 32 are being formed. Such needle-shaped by-products can interconnect certain spaced parts in the floating structure 30, thereby causing an electric short in the floating structure 30.

On the other hand, the first and second oxide films 12, 22 formed below the floating structure 30 are removed by wet etching, wherein the etchant contained in the wet etching liquid causes a capillary phenomenon (or so-called stiction phenomenon), which causes adhesion between the various parts in the floating structure 30 or between the first substrate 10 and the floating structure 30.

Notches generated in the floating structure 30, and electric shorts caused by a needle-shaped by-product and the stiction phenomenon are main detractors of device yield in producing a floating structure 30.

SUMMARY OF THE INVENTION

The present invention has been made to solve the above-mentioned problems of the prior art, and an object thereof is to provide a method of manufacturing a floating structure capable of providing increased device yield.

Another object of the present invention is to provide a more precise floating structure.

Still another object of the present invention is to provide a floating structure, in which the above-mentioned stiction and electric short phenomena can be prevented.

The above objects of the present invention have been achieved by providing a method of manufacturing a floating structure which comprises: a) forming an insulation film, a predetermined area of which is removed, between a first substrate and a second substrate; and b) forming a floating structure in an area corresponding to the removed predetermined area.

According to a preferred embodiment, the step a) comprises: a1) forming the insulation film, the predetermined area of which is removed, on the first substrate; a2) bonding the second substrate to the first substrate formed with the insulation film; and a3) polishing the second substrate to a predetermined thickness. In addition, the step a1) comprises: a1-1) forming the insulation film on the first substrate; and a1-2) removing the predetermined area from the insulation film formed on the first substrate.

The insulation film is preferably formed from a silicon oxide film and the step a1-1) is preferably implemented through an oxidation process. Step a1-2) is preferably implemented through a photolithographic process and an etching process, and step a2) is preferably implemented through a silicon direct bonding method. In addition, step a3) may be implemented through a lapping process and a CMP process.

Moreover, the step b) may be implemented through a photolithographic process and an etching process, wherein the etching process is implemented through RIE (reactive ion etching), which is a dry etching process, in particular by means of a deep RIE process. The deep RIE process is used to etch cavities having a relatively high aspect ratio, for example, by passivating the etched sidewalls with a fluoropolymer.

BRIEF DESCRIPTION OF THE DRAWINGS

The above aspects and features of the present invention will be more apparent from the description of certain embodiments of the present invention with reference to the accompanying drawings, in which.

DETAILED DESCRIPTION OF THE PREFERRED EMBODIMENTS

Hereinbelow, embodiments of the present invention are described in detail with reference to the accompanying drawings. However, the present invention should not be construed as being limited thereto.

Figure 1A:
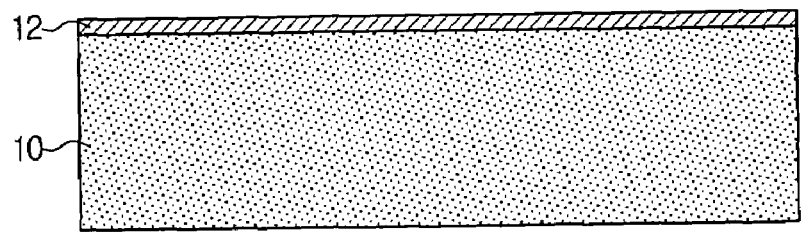
FIGS. 1A to 1E are process views illustrating a method of manufacturing a conventional floating structure.
Figure 1B:
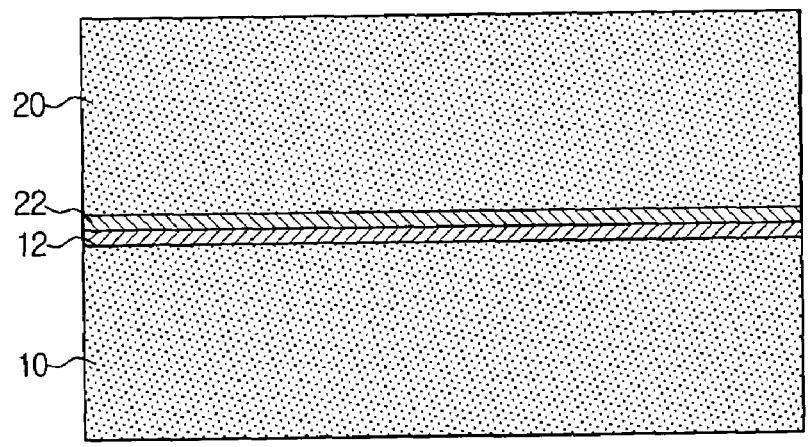
Figure 1C:
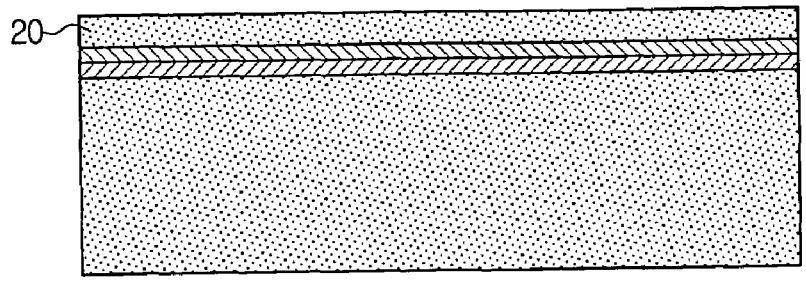
Figure 1D:
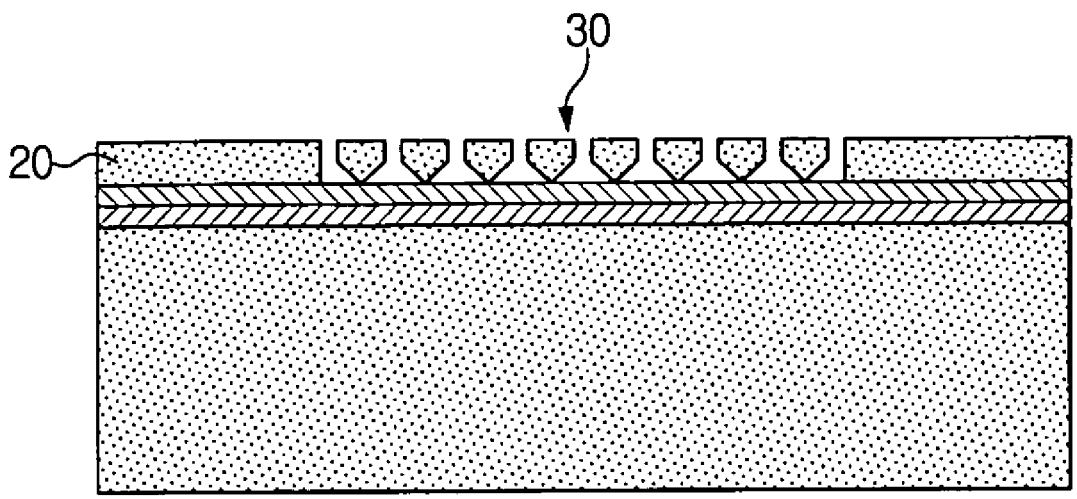
Figure 1E:
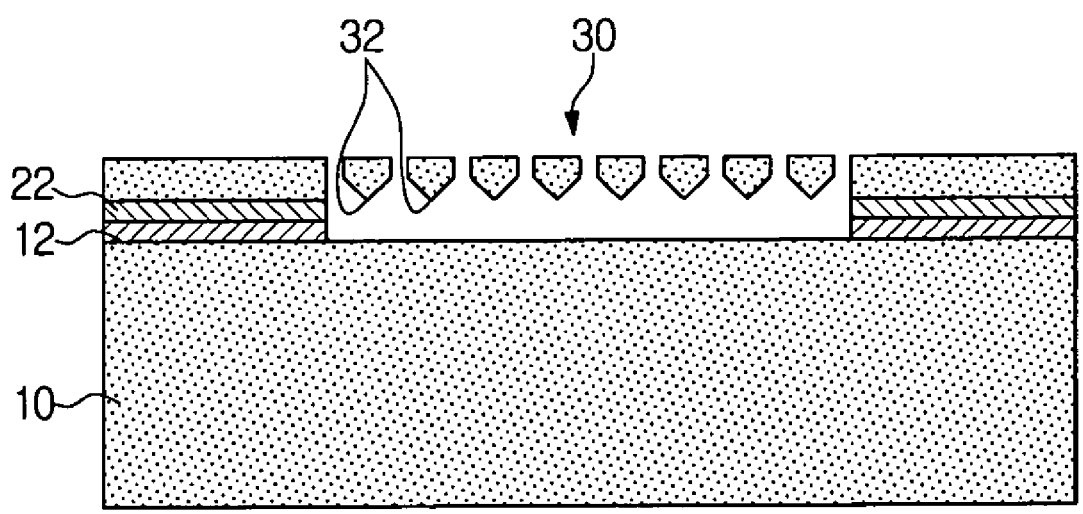
Figure 2A:
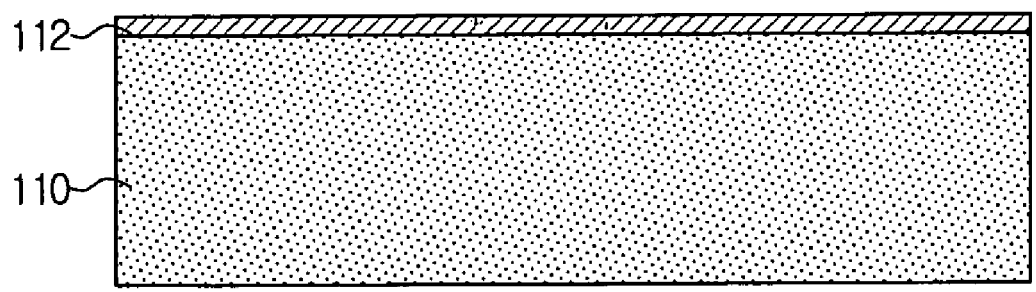
FIGS. 2A to 2E are process views for illustrating a method of manufacturing a floating structure according to an embodiment of the present invention.
Figure 2B:
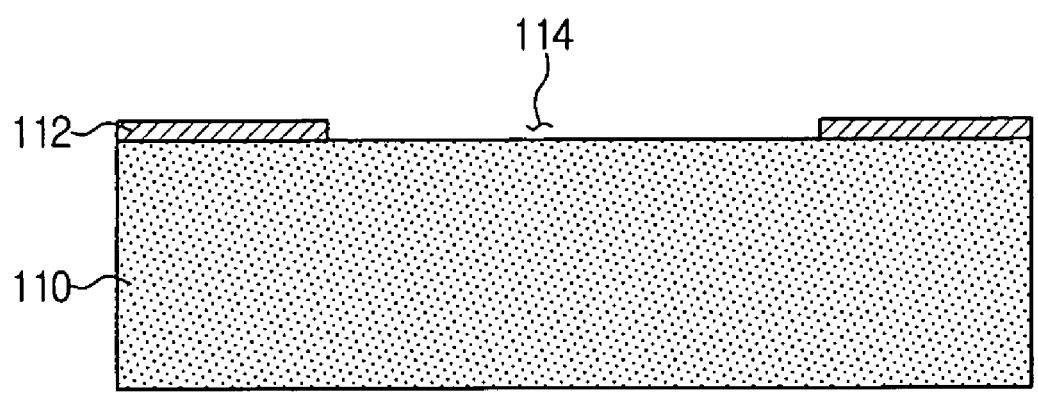
Figure 2C:
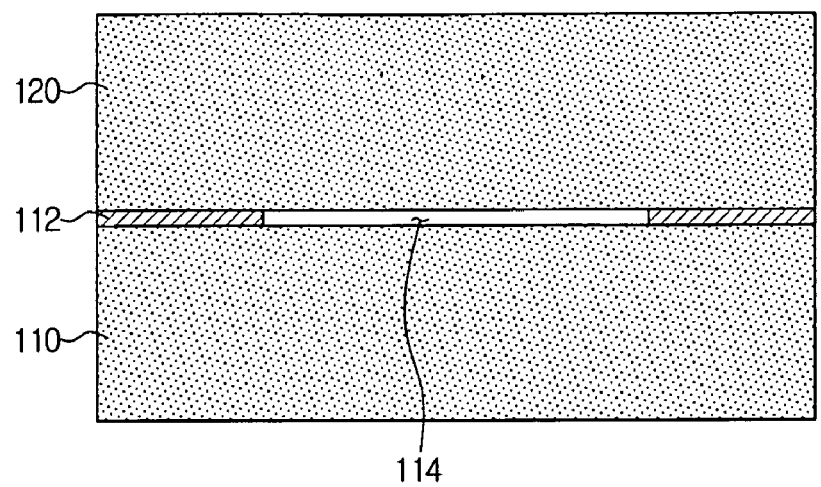
Figure 2D:
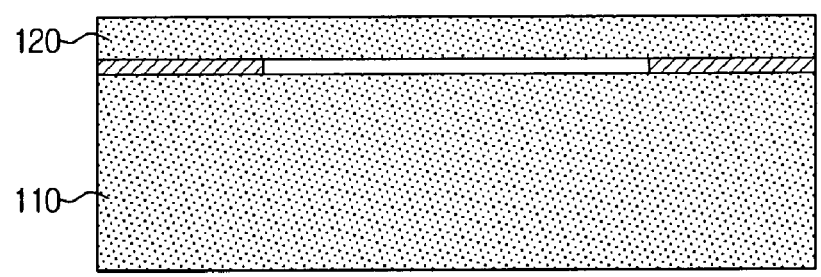
Figure 2E:
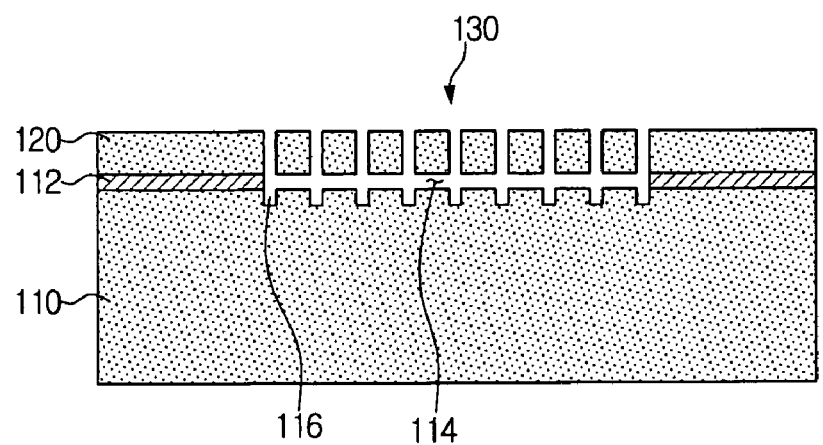

Referring to FIG. 2E, a floating structure 130 according to an embodiment of the present invention has a floating structure 130 formed by etching a second substrate 120, so that the floating structure 130 floats at a predetermined distance above the top side of a first substrate 110. Although not shown in the drawing, the floating structure 130 is partially supported by the first substrate 110, the second substrate 120 and/or an insulation film 112. For example, the floating structure 130 may comprise a projection portion which projects over predetermined area 114. The insulation film 112 is interposed between the first substrate 110 and the second substrate 120 to electrically isolate the first substrate 110 and the second substrate 120. The floating structure 130 configured as described above may be used as a structure having various functions of an inertia weight, a spring, etc., in various sensors.

Now, a method of manufacturing the floating structure 130 configured as described above is described in detail.

Referring to FIG. 2A, according to a preferred embodiment, the inventive method comprises a step of cutting a monocrystalline silicon ingot to prepare the first substrate 110 and the second substrate 120 (see FIG. 2C). Then, an insulation film 112 is formed on the first substrate 110. The insulation film 112 is formed on one side of the first substrate 110 is typically a silicon oxide film formed through an oxidation process. However, the insulation film 112 may be selected from various non-conductive films such as a nitride film, an epoxy film, a photoresist film, etc.

Referring to FIG. 2B, the insulation film 112 formed on the first substrate 110 is removed from a predetermined area 114. The predetermined area 114 is a portion corresponding to the bottom side of the floating structure 130 described below. By previously removing the portion underneath of the floating structure 130, it is possible to omit a wet etching step which was essential in a conventional method of manufacturing such a floating structure. Because the wet etching process is omitted, the stiction phenomenon, which occurs in a conventional method, can be prevented, thereby improving the yield of such a floating structure 130. The predetermined area 114 of the insulation film 112 is removed by photolithographic and etching processes. More specifically, photoresist is coated on the insulation film 112, and photoresist covering the predetermined area 114 to be removed from the insulation film 112 is irradiated through a mask and developed using a photolithographic process. Then, wet etching is performed to remove the exposed insulation film 112 of the predetermined area 114, and the remaining photoresist is then removed. Dry etching is preferably employed in the etching process. Although the predetermined area 114 is removed after the insulation film 112 is provided, it is possible to deposit the insulation film 112 on the first substrate 110 using a mask having a predetermined pattern. Beyond this, it is possible to form the insulation film 112, the predetermined area 114 of which is removed, on the first substrate 110 by using various other methods known to those of ordinary skill.

Referring to FIG. 2C, the second substrate 120 is bonded to the insulation film 112, the predetermined area 114 of which has been removed. In this manner, the predetermined area 114 is adapted to form a cavity 114. The second substrate 120 is bonded to the insulation film 112 of the first substrate 110 by a silicon direct bonding method. However, various bonding methods known to those of ordinary skill in the art can be employed, other than the direct bonding method.

Referring to FIG. 2D, the second substrate 120 bonded to the top side of the first substrate 110 is polished. The polishing process is employed to polish the second substrate 120 to a predetermined thickness, wherein the polishing process comprises a lapping step for polishing the second substrate 120 to a predetermined thickness and a CMP (chemical and mechanical polishing) step for improving the flatness and facial precision of the surface of the second substrate 120 polished to the predetermined thickness.

Referring to FIG. 2E, the floating structure 130 is formed in the second substrate 120 polished to a predetermined thickness. The process for forming the floating structure 130 comprises etching the second substrate in a predetermined pattern. More specifically, the floating structure 130 can be formed by coating photoresist on a side of the second substrate 120, and exposing and developing the photoresist in a pattern corresponding to the floating structure 130, and then etching the second substrate 120 along the pattern formed by developing the photoresist. Once the etching of the second substrate 120 is completed, the photoresist can be removed. In the etching process, RIE (reactive ion etching), which is a type of dry etching using ion particles in a plasma state, in particular, a deep RIE process, which is appropriate for etching a trench having a high aspect ratio cross-section, is preferably employed. The deep RIE process repeats the RIE process and a coating process for coating the area etched by the RIE process a plural number of times, in which the coating process can prevent the etched area (generally, the etched side walls) from being excessively etched by subsequent etching processes. Therefore, by using the deep RIE process, it is possible to more precisely etch in a high aspect ratio while keeping a constant cross-section. Because the floating structure 130 is desirably etched to have a constant cross-sectional shape, the etching is executed more deeply than the thickness of the floating structure 130. Therefore, a series of grooves 116 are formed in the first substrate 110 as shown in FIG. 2E. Because the insulation film 112 in the predetermined area 114 for forming the floating structure 130 is previously removed, there is no exposure of the existing oxide film while the etching is proceeding. Therefore, the oxide film is not exposed and not charged by the etching ions. A result, the path of subsequent ion beams are not changed, and it is possible to prevent the generation of a notch. Because a notch is not generated, physical properties such as mass and spring constant of the floating structure can achieve more accurate values. In addition, it is possible to avoid the occurrence of a needle-shaped by-product resulting from the generation of a notch formed as in a conventional technique.

According to the present invention, because the occurrence of a notch can be prevented, it is possible to manufacture a more precise floating structure.

In addition, because a needle-shaped by-product is not generated by preventing the occurrence of a notch, it is possible to prevent the floating structure from being electrically shorted.

Furthermore, because wet etching is not employed, it is possible to avoid a stiction phenomenon in fabricating the floating structure.

Because the occurrence of a notch, a needle-shaped by-product and a stiction phenomenon can be prevented, it is possible to increase the yield of the floating structure.

Although several embodiments of the present invention have been shown and described in order to exemplify the principle of the present invention, the present invention is not limited to the above-described specific embodiments. It will be understood that various modifications and changes can be made by one skilled in the art without departing from the spirit and scope of the invention as defined by the appended claims. Therefore, such modifications, changes and equivalents thereof are within the scope of the present invention.

What is claimed is:

1. A method of manufacturing a floating structure which comprises:
   a) forming an insulation film, of which a predetermined area is removed, between a first substrate and a second substrate; and
   b) forming a floating structure in an area corresponding to the removed predetermined area,
   wherein the forming of the floating structure comprises etching the second substrate deeper than a thickness of the floating structure such that a plurality of grooves are formed in the first substrate, and
   wherein the second substrate is clear of any insulation film, and the etching the second substrate does not involve etching any insulation film.

2. The method as claimed in claim 1, wherein the step a) comprises:
   a1) forming the insulation film, the predetermined area of which is removed, on the first substrate;
   a2) bonding the second substrate to the first substrate formed with the insulation film; and
   a3) polishing the second substrate to a predetermined thickness.

3. The method as claimed in claim 2, wherein the step a1) comprises:
   a1-1) forming the insulation film on the first substrate; and
   a1-2) removing the predetermined area from the insulation film formed on the first substrate.

4. The method as claimed in claim 3, wherein the insulation film comprises a silicon oxide film, and the step a1-1) is implemented through an oxidation process.

5. The method as claimed in claim 3, wherein the step a1-2) is implemented through a photolithographic process and an etching process.

6. The method as claimed in claim 2, wherein the step a2) is implemented through a silicon direct bonding method.

7. The method as claimed in claim 2, wherein the step a3) is implemented through a lapping process and a CMP process.

8. The method as claimed in claim 3, wherein the step b) is implemented through a photolithographic process and an etching process.

9. The method as claimed in claim 8, wherein the etching process is a dry etching process.

10. The method as claimed in claim 9, wherein the dry etching process is a RIE (reactive ion etching) process.

11. The method as claimed in claim 9, wherein the dry etching process is a deep RIE process.

12. A method of manufacturing a floating structure which comprises:
    A) providing a first substrate and a second substrate;
    B) forming an insulation film, a predetermined area of which is removed, on the first substrate;
    C) bonding the second substrate on the insulation film, the predetermined area of which has been removed;
    D) polishing the second substrate bonded to the first substrate to a predetermined thickness; and
    E) forming a floating structure in an area of the polished second substrate corresponding to the predetermined area,
    wherein the forming of the floating structure comprises etching the second substrate deeper than a thickness of the floating structure such that a plurality of grooves are formed in the first substrate, and
    wherein the second substrate is clear of any insulation film, and the etching the second substrate does not involve etching any insulation film.

13. A method as claimed in claim 12, wherein the insulation film comprises a silicon oxide film, and the step B) comprises:
    forming the silicon oxide film on the first substrate; and
    removing the predetermined area from the silicon oxide film formed on the first substrate through a photolithographic process and an etching process.

14. A method as claimed in claim 12, wherein the step C) is implemented through a silicon direct bonding method, and the step D) is implemented through a lapping process and a CMP process.

15. A method as claimed in claim 12, wherein the step E) is implemented through a photolithographic process and a deep RIE process.

* * * * *